(12) United States Patent
Yang et al.

(10) Patent No.: US 7,187,000 B2
(45) Date of Patent: Mar. 6, 2007

(54) HIGH PERFORMANCE TUNNELING-BIASED MOSFET AND A PROCESS FOR ITS MANUFACTURE

(75) Inventors: Kuo-Nan Yang, Taipei (TW); Yi-Ling Chang, Miro-Li (TW); You-Lin Chu, Taichung (TW); Hou-Yu Chen, Kanhsing (TW); Fu-Liang Yang, Hsin-Chu (TW); Chenming Hu, Alamo, CA (US)

(73) Assignee: Taiwan Semiconductor Manufacturing Company, Inc., Hsin-Chu (TW)

( * ) Notice: Subject to any disclaimer, the term of this patent is extended or adjusted under 35 U.S.C. 154(b) by 0 days.

(21) Appl. No.: 11/081,993

(22) Filed: Mar. 16, 2005

(65) Prior Publication Data

US 2006/0208316 A1   Sep. 21, 2006

(51) Int. Cl.
*H01L 23/62* (2006.01)
*H01L 29/10* (2006.01)

(52) U.S. Cl. .................................. 257/29.057; 257/360
(58) Field of Classification Search ...................... None
See application file for complete search history.

(56) References Cited

U.S. PATENT DOCUMENTS

| | | | |
|---|---|---|---|
| 5,401,998 A * | 3/1995 | Chiu et al. | 257/368 |
| 5,972,745 A * | 10/1999 | Kalter et al. | 438/220 |
| 6,261,878 B1 | 7/2001 | Doyle et al. | |
| 6,268,629 B1 | 7/2001 | Noguchi | |
| 6,306,691 B1 | 10/2001 | Koh | |
| 6,518,105 B1 * | 2/2003 | Yang et al. | 438/151 |
| 6,548,866 B2 * | 4/2003 | Noguchi | 257/345 |
| 6,674,130 B2 * | 1/2004 | Yang et al. | 257/360 |
| 2002/0047155 A1* | 4/2002 | Babcock et al. | 257/315 |
| 2003/0168701 A1* | 9/2003 | Voldman | 257/355 |

* cited by examiner

*Primary Examiner*—Evan Pert
*Assistant Examiner*—Benjamin P. Sandvik
(74) *Attorney, Agent, or Firm*—Haynes and Boone, LLP

(57) ABSTRACT

A semiconductor structure and a method for its manufacture are provided. In one example, the structure includes a well region doped with a first type dopant (e.g., a P-type or N-type dopant). A gate pedestal formed over the well region has two ends, one of which at least partially overlies the well region and is doped with the first type dopant. A dielectric layer is positioned between the gate pedestal and the well region. Source and drain regions formed on opposite sides of the gate pedestal within the well region are doped with a second type dopant opposite in type to the first type dopant.

19 Claims, 4 Drawing Sheets

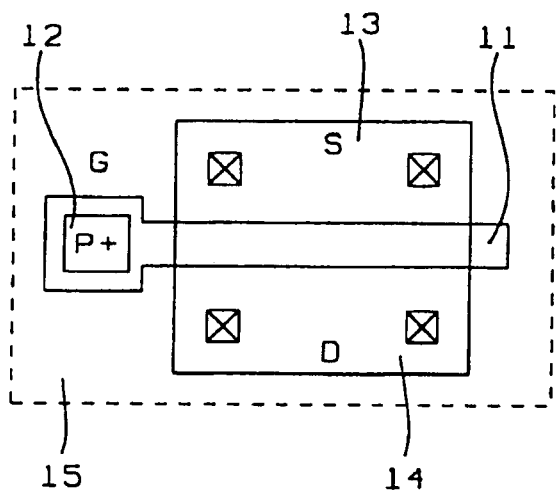
FIG. 1A – Prior Art
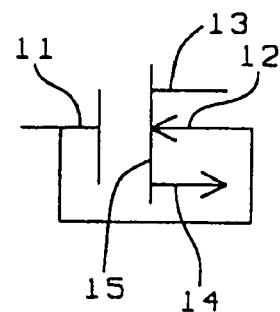
FIG. 1B – Prior Art
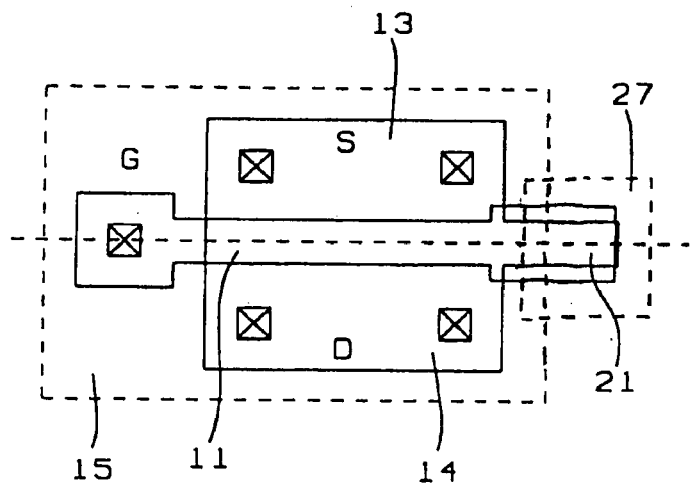
FIG. 2A
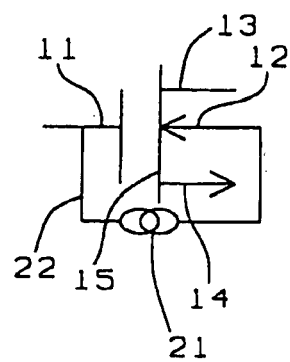
FIG. 2B

HIGH PERFORMANCE TUNNELING-BIASED MOSFET AND A PROCESS FOR ITS MANUFACTURE

BACKGROUND

Mobile and portable electronics have advanced rapidly and there is an increasing demand for high performance and low power digital circuits. The main technology approach for reducing power has been power supply scaling. Power supply scaling generally needs to be accompanied by threshold voltage reduction in order to preserve low $V_t$ device performance. Unfortunately, low $V_t$ tends to raise sub-threshold leakage.

One solution has been to tie the gate of a semiconductor device to the device's substrate so as to operate the device as a dynamic threshold voltage MOSFET (DTMOS). This is illustrated as a plan view in FIG. 1A and a schematic diagram in FIG. 1B. Illustrated is a gate pedestal 11 flanked by source 13 and drain 14. P+ connector 12 makes a hard connection between the gate 11 and the base 15. In this configuration, the gate input voltage forward biases the substrate/source junction and causes $V_{th}$ to decrease. However, the gate voltage of a DTMOS should be limited to approximately one diode voltage (e.g., −0.7 V at room temperature) to avoid significant junction leakage.

The present disclosure discloses a solution to this problem that allows a MOS device to operate under power supply voltages larger than 0.7 V.

BRIEF DESCRIPTION OF THE DRAWINGS

FIG. 1A is a plan view of a DTMOS (prior art) showing a hard connection from the gate to the base.

FIG. 1B is the schematic circuit equivalent of FIG. 1A.

FIG. 2A is a plan view of a tunneling-biased MOSFET (TBMOS) showing a tunneling connection from the gate to the base according to aspects of the present disclosure.

FIG. 2B is the schematic circuit equivalent of FIG. 2A.

DETAILED DESCRIPTION

Figure 3:
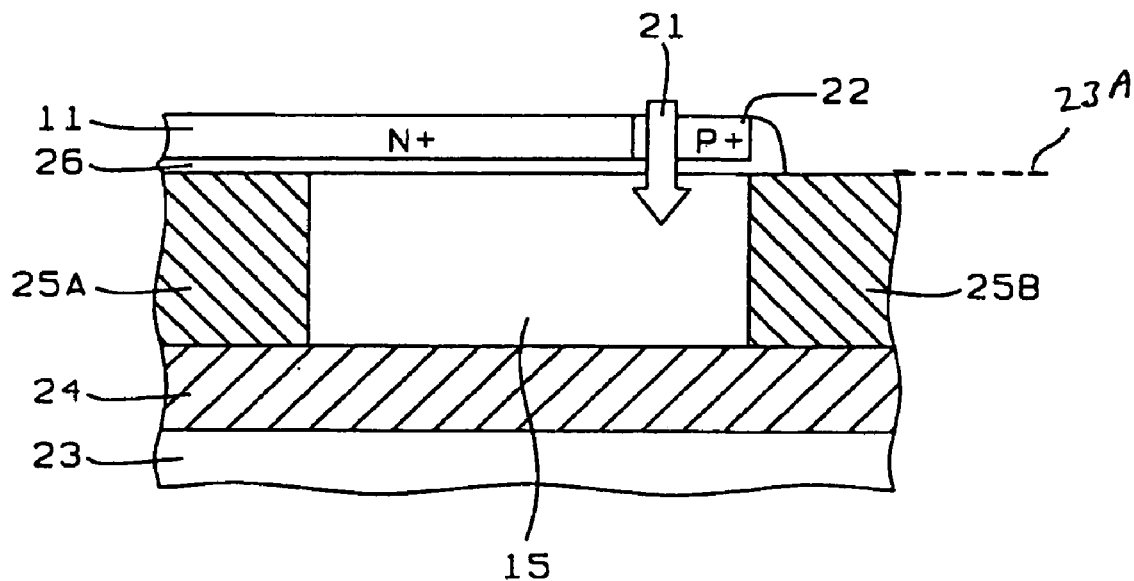
FIG. 3 is an approximate cross-section of FIG. 2A showing where hole tunneling between gate and base may occur.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 4:
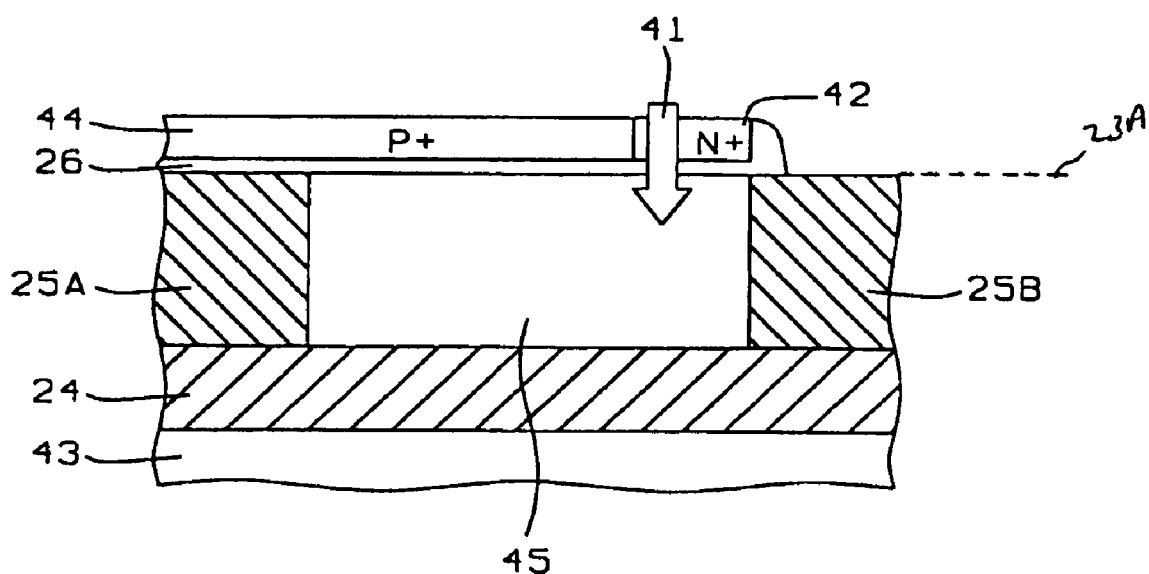
FIG. 4 is the equivalent of FIG. 3 for a PMOS device, showing where electron tunneling between gate and base may occur.

Referring to FIGS. 2A, 2B, and 3, one embodiment of an exemplary process begins with the provision of silicon body or wafer 23 (FIG. 3) having a first isolation area in the form of buried oxide layer 24 located between about 500 and 1,200 Angstroms below the top surface (illustrated by dotted line 23A) of the silicon body 23. For an NMOS device, the silicon body 23 would be P-type (FIG. 3), while for a PMOS device it would be N-type (43 in FIG. 4). The following description is directed to an NMOS device, but it is understood that the present disclosure may be applied to PMOS devices if the appropriate reversals of conductivity type are made.

A second isolation area in the form of oxide filled trenches, such as 25A and 25B, that extend downwards from top surface 23A as far as buried oxide layer 24 is formed. These trenches are disposed so as to fully enclose a volume of silicon (P-type in FIG. 3 and N-type in FIG. 4), resulting in the formation of P-well or base 15 in FIG. 3 (N-well 45 in FIG. 4)

Next, dielectric layer 26 is formed on the top surface of 25A. One example of such a dielectric layer 26 is a thermally grown silicon oxide, but the present disclosure will work if any other dielectric material that is suitable for use as a gate dielectric (e.g., silicon nitride) is substituted. In the present embodiment, the thickness of dielectric layer 26 should be less than the maximum thickness at which tunneling can still be observed (i.e., the tunneling threshold of the dielectric layer). Typically, the thickness of the dielectric layer 26 is between about 5 and 100 Angstroms.

This is followed by the deposition of layer 11 (44 in FIG. 4), usually polysilicon, over dielectric layer 26. This polysilicon layer 11 is then patterned to form a gate pedestal (also referenced by numeral 11) as shown in plan view 2A and schematic view 2B. The gate pedestal 11 has a thickness between about 300 and 1500 Angstroms and has a width between about 0.05 and 0.1 microns. Gate pedestal 11 extends from a position above STI trench 25A, across the well 15, and at least partially over STI trench 25B, giving the gate pedestal 11 a length of between about 0.5 and 1 microns. It is understood that, although the plan view of FIG. 2A does not illustrate STI trenches 25A and 25B, the STI trenches are positioned within the well 15 in conformance with FIG. 3. Gate pedestal 11 is then used as a hard mask during the removal of all of dielectric layer 26 that is not directly beneath it Using a suitable mask, donor ions are implanted in a region that overlaps the gate pedestal 11 on both sides, as seen in FIG. 2A, so as to form source and drain regions (13 and 14 respectively in FIG. 2A) on opposite sides of the gate pedestal 11. These donor ions are implanted to a concentration between about $10^{19}$ and $10^{20}$ ions per $cm^3$. For the PMOS device, acceptor ions would be implanted to a concentration between about $10^{19}$ and $10^{20}$ ions per $cm^3$. Additional process steps may be introduced at this stage to produce variations on this general approach (e.g., a lightly doped drain).

For a conventional device of the prior art, this would typically be the end of the process. However, the present embodiment involves the use of an additional step. This step involves the implantation of acceptor ions (through a mask) in region 27 (FIG. 2A) that overlaps one end (denoted by reference numeral 22 (42 in FIG. 4)) of the gate pedestal 11 by between about 0.01 and 1 microns. These acceptor ions are implanted to a concentration between about $10^{19}$ and $10^{20}$ ions per cm$^3$. For the PMOS device, donor ions would be implanted to a concentration between about $10^{19}$ and $10^{20}$ ions per cm$^3$. The presence of the P+ region 22 at the end of gate pedestal 11 causes a tunneling connection 21 for holes to be formed. Similarly, the presence of N+ region 42 at the end of gate pedestal 44 (FIG. 4) causes a tunneling connection 41 for electrons to be formed. It is understood that the overlap of region 27 with well 15 as illustrated in FIG. 2A is for purposes of example only and that more or less overlap may occur. In addition, the size of the region 27 may be reduced or enlarged as desired.

Figure 5:
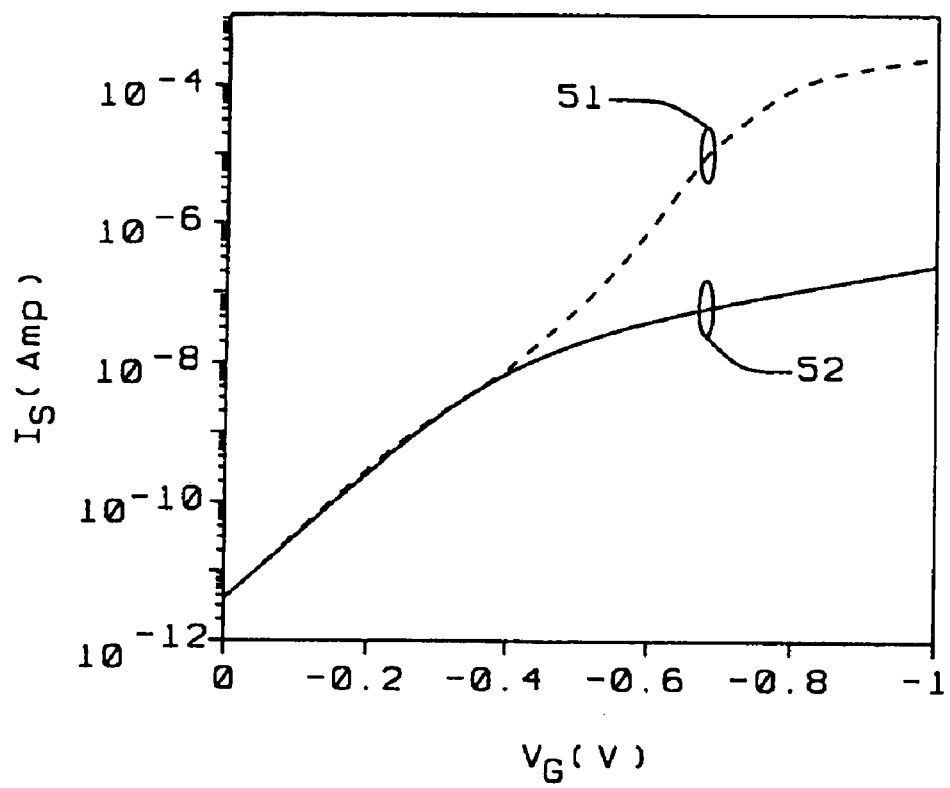
FIG. 5 compares source-drain current vs. gate voltage for DTMOS and TBMOS devices.

A comparison between a DTMOS device (prior art) and a TBMOS device (present disclosure) is presented in FIG. 5, which plots source-to-drain current as a function of gate voltage. Curve 51 is for a conventional device (DTMOS), while curve 52 is for a device made as described above (TBMOS). As is illustrated in FIG. 5, the leakage of the DTMOS device is significantly larger than that of the TBMOS device by about three orders of magnitude. This shows that a TBMOS device can operate at a power supply voltage ($V_{dd}$) that is greater than 0.7 V.

Figure 6:
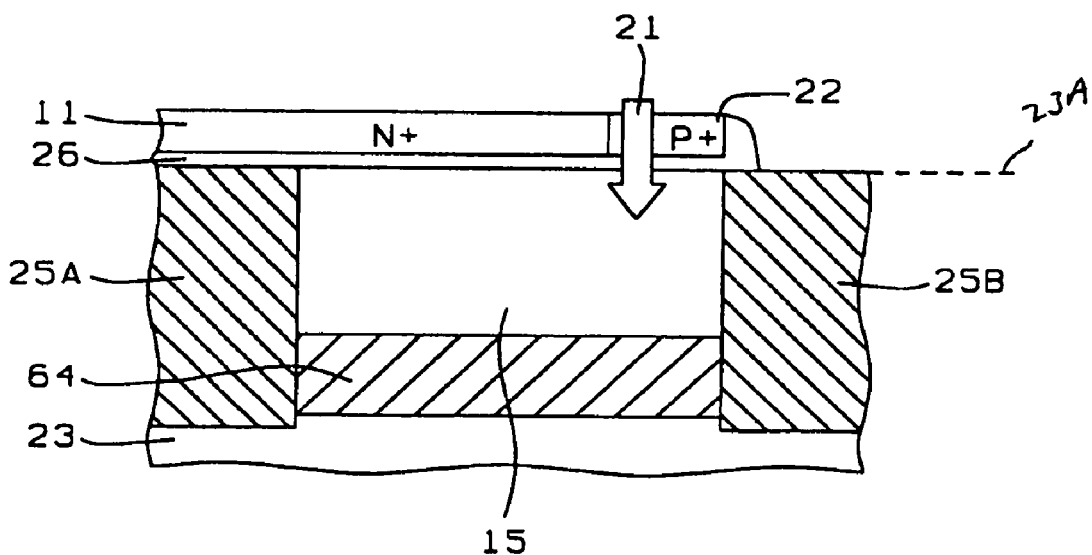
FIG. 6 shows an alternative embodiment in which device isolation is achieved through use of a buried N− layer instead of a buried oxide layer.
Figure 7:
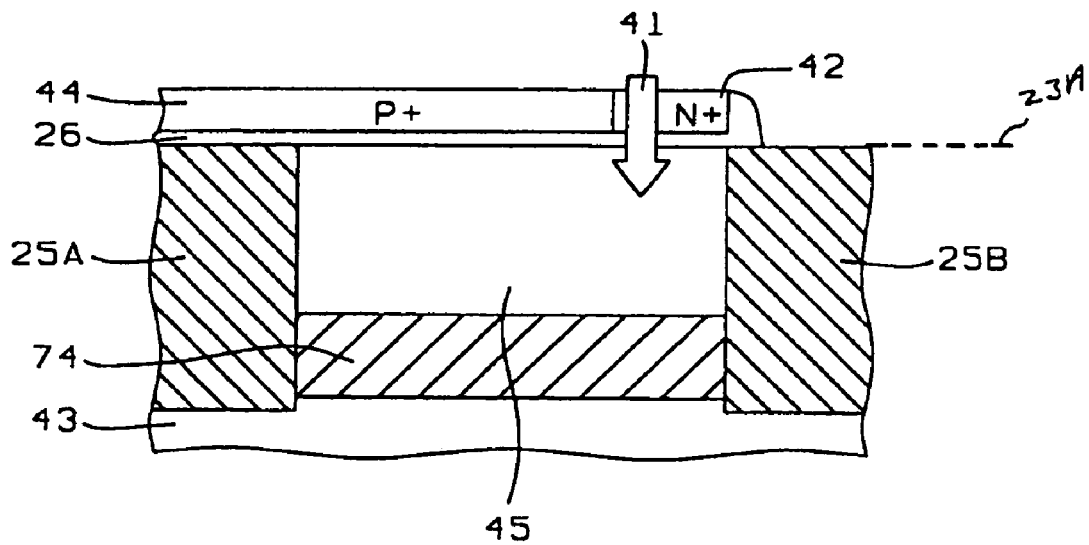
FIG. 7 shows the PMOS equivalent of FIG. 6.

It is also possible to isolate the lower portion of well 15 (45 in FIG. 4) from the rest of the substrate by means of junction isolation rather than through use of a buried oxide layer. This embodiment of the disclosure is illustrated in FIG. 6 for the NMOS version and in FIG. 7 for its PMOS equivalent. Buried N– layer 64 is seen in FIG. 6 and buried P– layer 74 is seen in FIG. 7. Both replace the buried oxide layer 24 seen in FIGS. 3 and 4.

Figure 8:
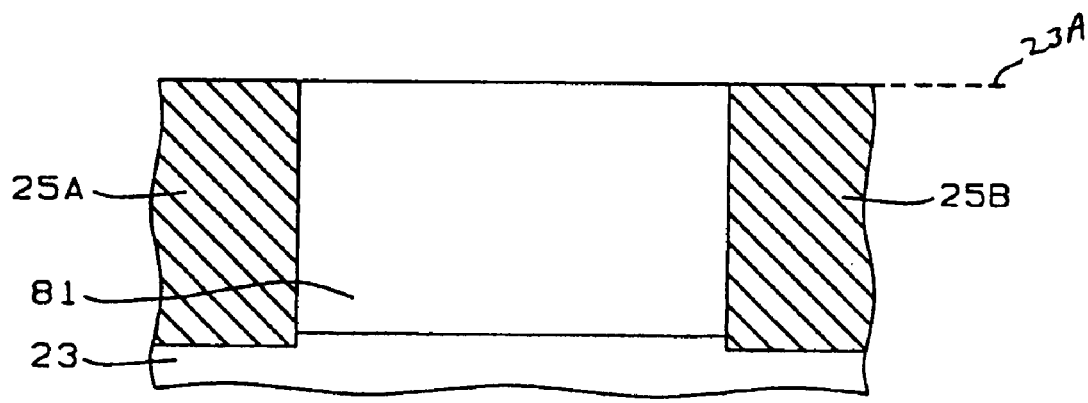
FIGS. 8 and 9 illustrate intermediate steps in the manufacture of the device seen in FIG. 6.
Figure 9:
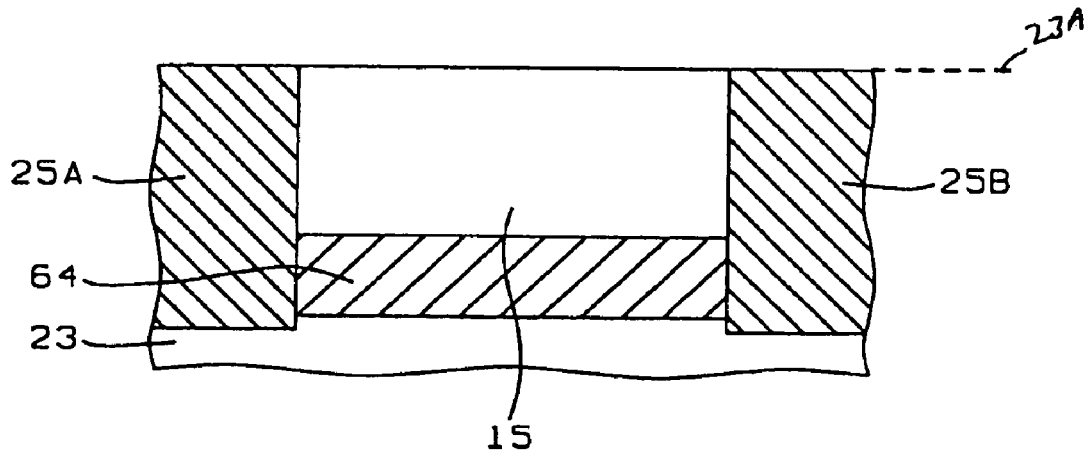

This embodiment may be manufactured in much the same way as the earlier buried oxide version except that the deep isolation trenches 25A and 25B may be formed first. In the NMOS version, as shown in FIG. 8, this is followed by donor ion implantation into P substrate 23 to a depth less than that of the trenches, thereby forming deep N– region 81. Then, acceptor ions are implanted to a lesser depth, thereby forming well region 15 as before (see FIG. 9).

The PMOS version may be formed in the same way except that the starting wafer is N type and the order of ion implantation involves acceptor ions followed by donor ions.

In another embodiment, an NMOS or PMOS transistor may be fabricated using a partially-depleted 0.1 micron CMOS/SOI technology. For example, the substrates may be 8" SIMOX wafers with a buried oxide thickness of 1500 Angstroms. Partially depleted transistors may be processed on a 1900 Angstrom thick silicon film, with STI (shallow trench isolation) used for electrical isolation of the transistors. A polysilicon gate is deposited after thermal growth of gate oxide. One feature provided by the present embodiment is the extension of the thin gate oxide layer and p+ polysilicon regions to provide hole tunneling in order to increase the body potential in the transistor "on" state.

One advantage of replacing dielectric isolation with junction isolation may include a reduction in crosstalk between N-TBMOS and P-TBMOS devices as circuit density increases.

It has been an object of at least one embodiment of the present disclosure to provide an FET device suitable for operation at very low voltage and power.

Another object of at least one embodiment of the present disclosure is that the device not be limited to a maximum applied voltage of 0.7 V at room temperature to avoid significant junction leakage.

Still another object of at least one embodiment of the present disclosure is to provide a process for manufacturing the device.

These objects have been achieved in some embodiments by eliminating the hard connection between gate and base that is featured in dynamic threshold voltage devices (DT-MOS). In its place, the present disclosure introduces a tunneling connection between the gate and the base. This is achieved by using a gate dielectric whose thickness is below its tunneling threshold. A region near one end of a gate pedestal is implanted to be P+ in an NMOS device (or N+ in a PMOS device). This allows holes (electrons for PMOS) to tunnel from gate to base. Since the hole current is self limiting, applied voltages greater than 0.7 volts may be used without incurring excessive leakage. A process for manufacturing the device is also described.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A semiconductor structure comprising:
   first and second isolation structures positioned to form first and second boundaries, the first and second isolation structures each have a first end, a second end, and an interior wall;
   a well region defined by the interior walls of the first and second boundaries, and doped with a first type dopant;
   a gate pedestal formed over the well region and having a first end and a second end distally positioned from the first end, wherein the second end at least partially overlies the well region and is doped with the first type dopant;
   a dielectric layer positioned between the gate pedestal and the well region;
   a source region and a drain region formed on opposite sides of the gate pedestal within the well region and doped with a second type dopant opposite in type to the first type dopant; and
   a junction isolation feature positioned between the well region and a substrate underlying the well region and configured to provide isolation between a lower region of the well region and the substrate, wherein the junction isolation feature is further positioned adjacent the interior walls of the first and second boundaries a distance that is not greater than that separating the first and second boundaries.

2. The semiconductor structure of claim 1 wherein the first end extends at least partially over the first isolation structure and the second end extends at least partially over the second isolation structure.

3. The semiconductor structure of claim 2 wherein the first and second isolation features are shallow trench isolation features.

4. The semiconductor structure of claim 1 wherein the first type dopant is a P-type dopant and the second type dopant is an N-type dopant.

5. The semiconductor structure of claim 4 wherein the second end is doped with a concentration of acceptor ions between about $10^{19}$ and $10^{20}$ ions per cm$^3$.

6. The semiconductor structure of claim 1 wherein the first type dopant is an N-type dopant and the second type dopant is a P-type dopant.

7. The semiconductor structure of claim 6 wherein the second end is doped with a concentration of donor ions between about $10^{19}$ and $10^{20}$ ions per cm$^3$.

8. The semiconductor structure of claim 1 further comprising a buried oxide layer positioned between the well region and a substrate underlying the well region.

9. The semiconductor structure of claim 1 wherein the dielectric layer has a thickness between about 5 and 100 Angstroms.

10. The semiconductor structure of claim 1 wherein the gate pedestal has a thickness between about 300 and 1500 Angstroms.

11. The semiconductor structure of claim 1 wherein the gate pedestal has a width between about 0.05 and 0.1 microns.

12. The semiconductor structure of claim 1 wherein the gate pedestal has a length between about 0.5 and 1 microns.

13. A tunneling-biased MOSFET structure comprising:
  a semiconductor body having an upper region including a first type dopant and a lower region configured as an isolation region at a first depth under a top surface of the upper region, and a substrate isolated from the upper region by the lower region;
  a dielectric isolation area extending downwards from the top surface to a second depth that is not less than the first depth, wherein the dielectric isolation area and lower region form a well comprising at least a portion of the upper region, and wherein the lower region provides isolation of the substrate and the well from one another;
  a gate pedestal having two opposing long sides that extend from a first end across the well to a second end;
  a dielectric layer positioned between the gate pedestal and the top surface;
  source and drain regions disposed on the opposing long sides of the gate pedestal, wherein each of the source and drain regions is doped with a second type dopant; and
  a doped region within one of the first and second ends of the gate pedestal, wherein the doped region includes the first type dopant and extends at least partially over the well.

14. The MOSFET structure of claim 13 wherein the first type dopant is a P-type dopant and the second type dopant is an N-type dopant.

15. The MOSFET structure of claim 14 wherein the doped region is doped with a concentration of acceptor ions between about $10^{19}$ and $10^{20}$ ions per cm$^3$.

16. The MOSFET structure of claim 13 wherein the first type dopant is an N-type dopant and the second type dopant is a P-type dopant.

17. The MOSFET structure of claim 16 wherein the doped region is doped with a concentration of donor ions between about $10^{19}$ and $10^{20}$ ions per cm$^3$.

18. A semiconductor structure comprising:
  a semiconductor body having a well region doped with a first dopant type and spaced from a substrate;
  a gate pedestal doped with the first dopant type, and formed over the well region and having a first end and a second end spaced from the first end;
  a first filled trench and a second filled trench spaced from the first filled trench, each of which is disposed between the gate pedestal and the substrate, each filled trench having a bottom surface adjacent the substrate and an interior wall and wherein the space between the interior walls forms the well region;
  a generally planar junction isolation feature disposed above the substrate and entirely between the interior walls of the first and the second filled trenches, the generally planar junction feature traversing the space between the first and the second filled trenches; and
  a source region and a drain region formed on opposite sides of the gate pedestal within the well region and doped with a second dopant type opposite in type to the first dopant type.

19. The semiconductor structure of claim 18 wherein the second end at least partially overlies the well region and is doped with the first type dopant.

* * * * *